United States Patent
Fuhrer et al.

(10) Patent No.: US 9,001,574 B2
(45) Date of Patent: Apr. 7, 2015

(54) SPIN LOGIC BASED ON PERSISTENT SPIN HELICES

(71) Applicant: International Business Machines Corporation, Armonk, NY (US)

(72) Inventors: Andreas Fuhrer, Zurich (CH); Gian R Salis, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 13/898,589

(22) Filed: May 21, 2013

(65) Prior Publication Data

US 2013/0314985 A1 Nov. 28, 2013

(51) Int. Cl.
*G11C 11/14* (2006.01)
*G11C 11/16* (2006.01)
*H01L 29/66* (2006.01)

(52) U.S. Cl.
CPC ........ *G11C 11/1673* (2013.01); *G11C 11/1675* (2013.01); *H01L 29/66984* (2013.01); *Y10S 977/933* (2013.01); *Y10S 977/935* (2013.01)

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 438/3; 977/933–935
See application file for complete search history.

(56) References Cited

U.S. PATENT DOCUMENTS

| 6,218,718 | B1* | 4/2001 | Gregg et al. | 257/421 |
| 6,713,195 | B2* | 3/2004 | Wang et al. | 428/811.2 |
| 7,960,752 | B2  | 6/2011 | Kobayashi | |
| 8,508,984 | B2* | 8/2013 | Ranjan et al. | 365/158 |
| 8,535,952 | B2* | 9/2013 | Ranjan et al. | 438/3 |
| 2002/0146580 | A1* | 10/2002 | Wang et al. | 428/469 |
| 2007/0296516 | A1* | 12/2007 | Eshaghian-Wilner et al. | 333/101 |
| 2010/0123133 | A1* | 5/2010 | Wunderlich et al. | 257/48 |

FOREIGN PATENT DOCUMENTS

CN 102403450 A 4/2012

OTHER PUBLICATIONS

L. Yang et al. "Random Walk Approach to Spin Dynamics in a Two-Dimensional Electron Gas With Spin-Orbit Coupling," Physics Review B, vol. 82, Issue 15, 2010.

(Continued)

*Primary Examiner* — Harry W Byrne
(74) *Attorney, Agent, or Firm* — Vazken Alexanian

(57) ABSTRACT

A spin logic device which includes an electron confinement layer confining an electron gas in a two-dimensional area (2DEG) subtended by a direction x and a direction y, the latter perpendicular to the former. The spin logic device is configured for the 2DEG to support a persistent spin helix (PSH) formed therein with a given spin component oscillating with periodicity λ along direction x but not oscillating along direction y. Majority logic circuit of the spin logic device includes: at least one input device energizable to create respective local spin-polarizations of the 2DEG in first regions of the confinement layer. The input device is configured to detect in a second region of the confinement layer an average spin-polarization of the 2DEG diffused through resulting PSHs, wherein a projection of a distance between the second region and first regions onto direction x is equal to nλ/a, n integer, a equal to 2 or 4.

20 Claims, 6 Drawing Sheets

(56) References Cited

OTHER PUBLICATIONS

Wunderlich et al. "Spin Hall Effect Transistor," Science, Reports, Dec. 24, 2010, pp. 1801-1804. American Association for the Advancement of Science.

Khitun et al., "Spin wave magnetic NanoFabric: A new approach to spin-based logic circuitry, IEEE Transactions on magnetics", 44, 2141 (2008).

Koralek et al., "Emergence of the persistent spin helix in semiconductor quantum wells", Nature 458, 610 (2009).

B. Behin-Aein et al., "Proposal for an all-spin logic device with built-in memory", Nature Nanotechnology 5, 266 (2010).

J. Schliemann et al., "Nonballistic spin-field-effect transistor", Phys. Rev. Lett. 90, 146801 (2003).

B.A. Bernevig., "Exact SU(2) symmetry and persistent spin helix in a spin-orbit coupled system", Phys. Rev. Lett. 97, 236601 (2006).

R.P. Cowburn et al., "Room-temperature magnetic quantum cellular automata", Science 287, 1466 (2000).

A. Imre et al., "Majority logic gate for magnetic quantum-dot cellular automata", Science 311, 205 (2006).

* cited by examiner

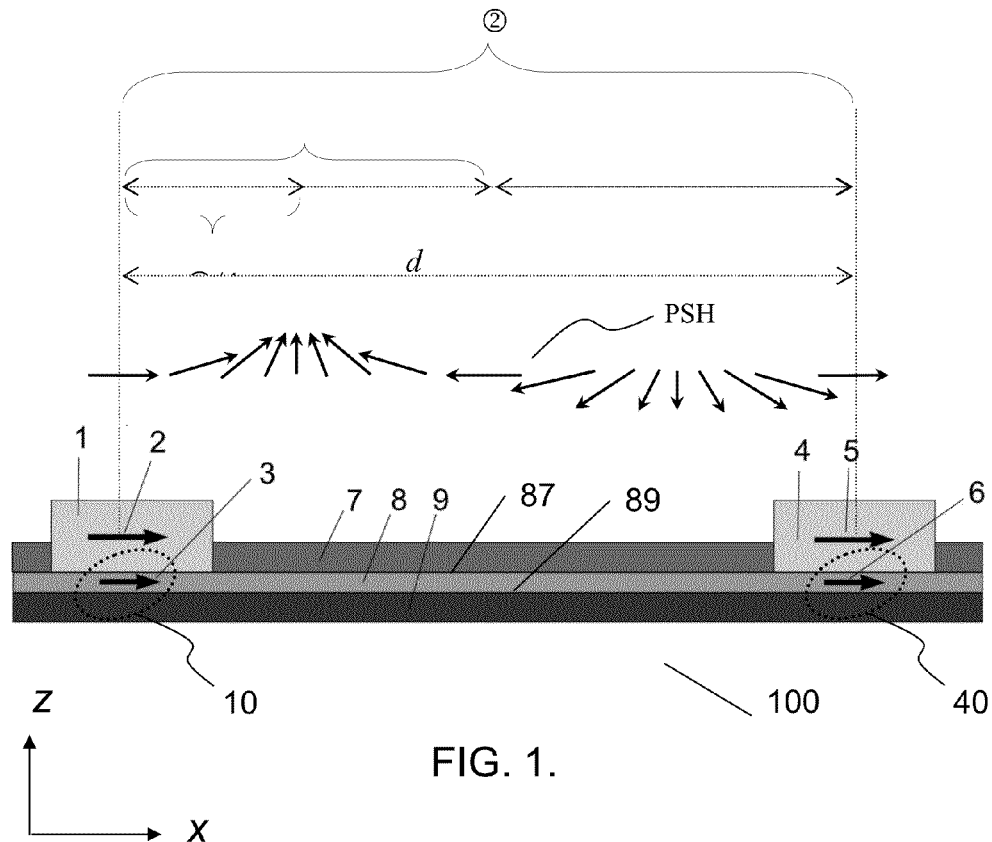
FIG. 1.
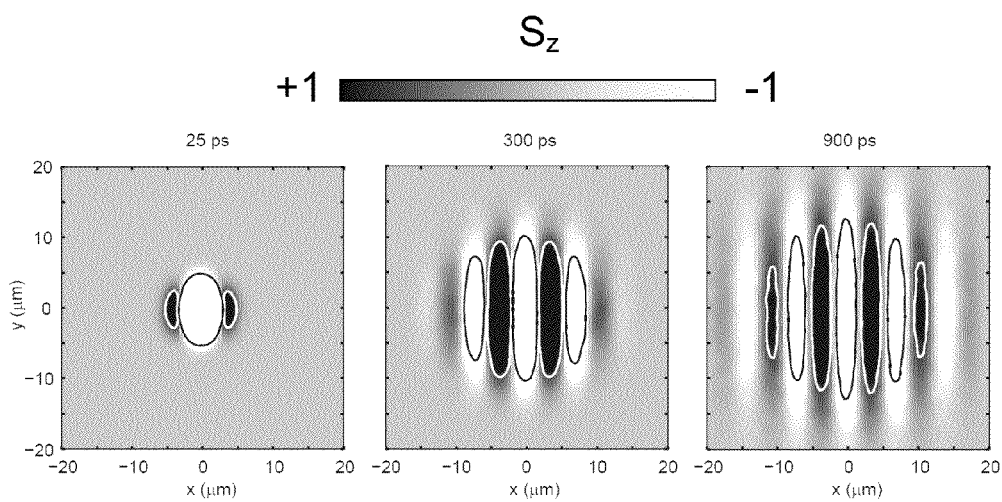
FIG. 2.A  FIG. 2.B  FIG. 2.C

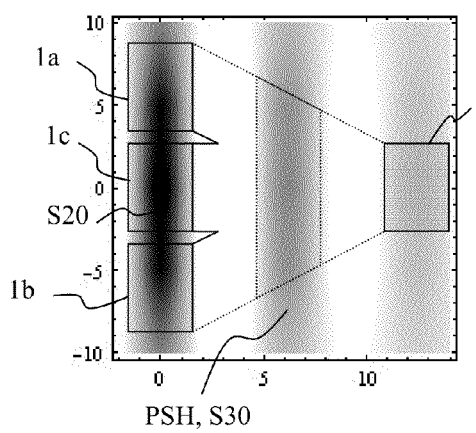
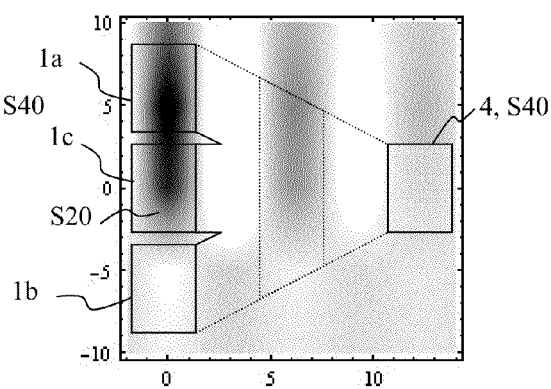
FIG. 3.A          FIG. 3.B
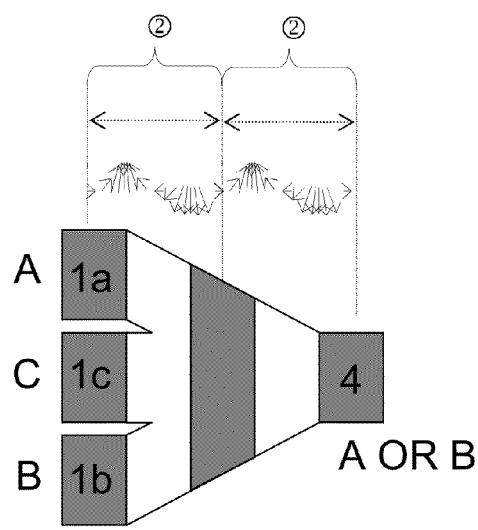
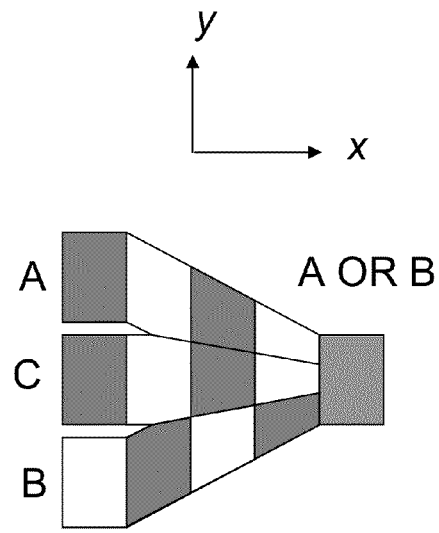
FIG. 3.C          FIG. 3.D
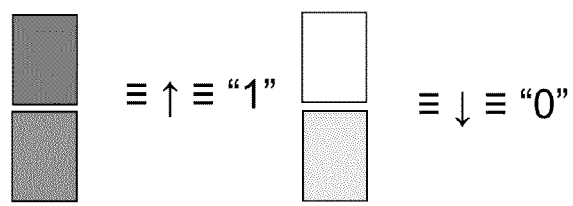

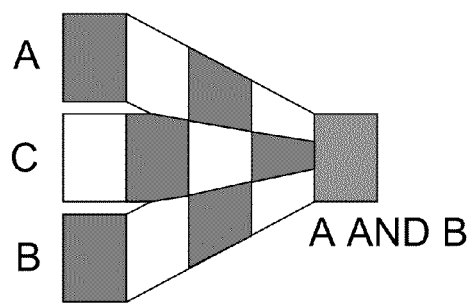
FIG. 4.A
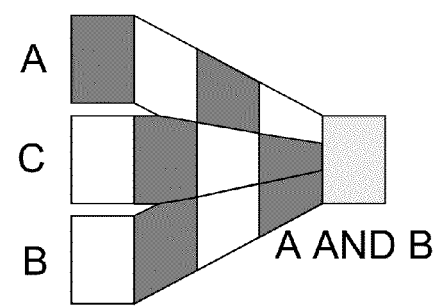
FIG. 4.B
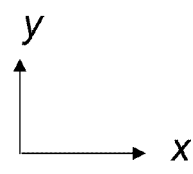
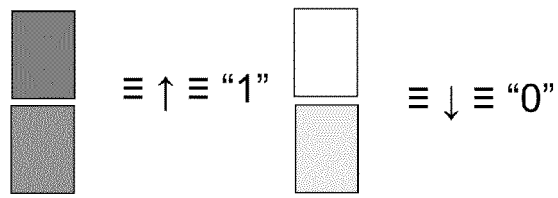

SPIN LOGIC BASED ON PERSISTENT SPIN HELICES

CROSS-REFERENCE TO RELATED APPLICATION

This application claims priority under 35 U.S.C. §119 from United Kingdom (GB) Patent Application No. 1209081.7 filed May 24, 2012, the entire contents of which are incorporated herein by reference.

FIELD OF THE INVENTION

The invention relates in general to the field of spin logic devices implementing logic circuits, in particular to majority logic circuits.

BACKGROUND OF THE INVENTION

A number of concepts have been proposed that are based on the electron spin, like cellular automata. In particular, spin devices have been suggested, which include a spin transport layer (or STL) above a substrate. Connected to the STL are input and output electrodes. The input electrodes act as spin injection contacts and consist of a magnetic material that is magnetized into one of two possible directions (spin up/down). By passing a current between the input electrodes and the STL, spin-polarized electrons can be accumulated in the STL at the interface between the input electrode and the STL. The spin polarization of electrons at that location in the STL is directly related to the magnetization of the input electrode, i.e. the spins in the STL are also either up or down. The output electrodes convert the local spin polarization at the interface between the STL and the output electrode. Spin polarization is e.g. converted into an electrical signal.

The concepts of input and output electrodes acting as spin injection and spin detection contacts are well described in literature. Also the concept of spin amplification where the magnetization of a detection electrode takes over the spin polarization in a STL is known. In between the input and output electrodes, the spin polarization imprinted by the input electrode propagates by diffusion or drift.

Besides, it has been demonstrated how logic gates can be constructed using majority-logic concepts where several input electrodes polarize the electron spin in the STL and the output electrode detects the average spin polarization that diffuses from those input electrodes to the output electrode.

SUMMARY OF THE INVENTION

According to a first aspect, the present invention is embodied as a spin logic device, including: an electron confinement layer confining an electron gas in a two-dimensional area (2DEG) subtended by a direction x and a direction y, the latter perpendicular to the former, the spin logic device configured for the 2DEG to support a persistent spin helix or PSH formed therein with a given spin component oscillating with periodicity λ along direction x but not oscillating along direction y; and a logic circuit, the circuit including: one or more input devices, energizable to create respective local spin-polarizations of the 2DEG in respective first regions of the confinement layer, such as to form respective PSHs; and an output device, configured to detect, in a second region of the confinement layer, an average spin-polarization of the 2DEG resulting from one or more local spin-polarizations created by the one or more input devices and diffused through one or more resulting PSHs, respectively, wherein a projection of a distance between the second region and any one of the first regions onto the direction x is equal to nλ/a, n integer, a equal to 2 or 4.

According to another aspect, the present invention is embodied as a method for operating a spin logic device. The method includes the steps of: energizing one or more of the input devices; and detecting an average spin-polarization of the 2DEG via the output device.

Devices and methods embodying the present invention will now be described, by way of non-limiting examples, and in reference to the accompanying drawings.

BRIEF DESCRIPTION OF SEVERAL VIEWS OF THE DRAWINGS

FIG. 1 is a section view of a simplified representation of a spin-logic device, according to an embodiment of the present invention.

FIGS. 2A-2C represent density plots which are direct mapping and simulated, where representative contours have been emphasized, illustrating the formation of a persistent spin helix at three different times after spin injection.

FIGS. 3-8 schematically illustrate the construction of logic gates using a persistent spin helix to propagate information from spin injection devices to output devices, according to embodiments.

FIGS. 3A-3B represent density plots that are direct mapping and simulated, illustrating persistent spin helices formed upon parallel spin injections. Depictions of components of a majority logic circuit are superimposed on the density plots. Spin injection and detection correspond to OR logic gate operations for inputs A and B.

FIGS. 3C-3D are simplified representations for FIGS. 3A-3B.

FIGS. 4A-4B schematically illustrate AND logic gate operations.

FIG. 5 illustrates an inversion (NOT) operation.

FIG. 6 is an example of combined logic gate calculating which can be A OR B AND D.

FIG. 7 illustrates the construction of two logic gates which can be A OR B and A AND B.

FIG. 8 is an example of OR gate along a direction where the spin does not oscillate, as additionally involved in embodiments.

DETAILED DESCRIPTION OF THE INVENTION

Figure 5:
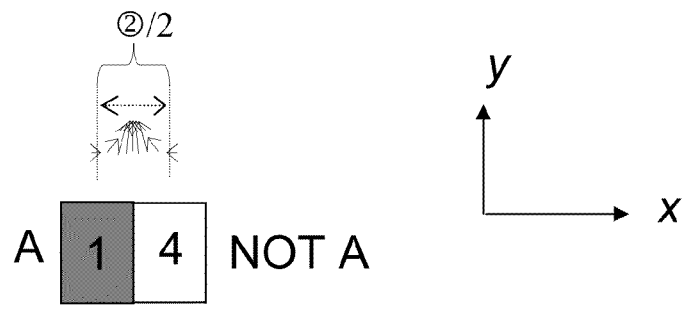

In a preferred embodiment, the logic circuit is a majority logic circuit that includes three or more input devices, the three or more input devices preferably including three input devices aligned along direction y.

In particular, the majority logic circuit can include at least two logic inputs and one control input.

Preferably, the output device is configured to detect an average spin-polarization for: the given spin component if a=2; and/or a perpendicular spin component if a=4 and n is odd.

According to an embodiment, the spin logic device further includes an additional set of one or more input devices, energizable to create respective local spin-polarizations of the 2DEG in respective third regions of the confinement layer, such as to form respective PSHs, wherein a projection of a distance between any one of the third regions and any one of the first regions onto the direction x is equal to lλ/a, l integer, a equal to 2 or 4, with preferably l=n.

Preferably, the output device is a first output device and the spin logic device further includes an additional output device, opposite to the first output device with respect to the one or more input devices, the additional output device configured to detect a spin-polarization of the 2DEG within a fourth region of the confinement layer, the fourth region at a distance from the first region, a projection of the distance onto direction x being equal to $m\lambda/a$, m integer, a equal to 2 or 4, and wherein preferably m=n.

In a preferred embodiment, the spin logic device further includes at least one output device configured with respect to one or more input devices to detect an average spin-polarization of the 2DEG propagating along direction y in the confinement layer.

In an embodiment, the spin logic device includes three or more layers of semiconductor materials, the electron confinement layer formed within one of the three or more layers or at an interface between two contiguous layers of the three or more layers.

Typically, the layers of semiconductor materials determine symmetry of the spin-orbit interaction or SOI to which the 2DEG is exposed such that the 2DEG is adapted to support the PSH.

For instance, the layers of semiconductor materials define a given bulk inversion asymmetry and a given structure inversion asymmetry, the symmetry of the SOI determined by the given bulk inversion asymmetry and the given structure inversion asymmetry.

The input devices can be electrodes, whose extension dimensions along direction x is less than $\lambda/2$, and preferably less than $\lambda/4$.

Preferably, a distance between the second region and the closest one of the first regions is equal to $n\lambda/a$, n integer, a equal to 2 or 4, and wherein, preferably, a=2 and n=4.

In a preferred embodiment, the logic circuit of the spin logic device is a majority logic circuit that includes at least two logic inputs and at least one control input, and energizing includes energizing each of the two logic inputs and the control input to create respective local spin-polarizations of the 2DEG.

Preferably, the created spin-polarizations exhibit opposite spin-polarizations.

The method for operating a spin logic device includes: energizing one or more of the input devices; and detecting an average spin-polarization of the 2DEG via the output device.

The following description is structured as follows. First, general embodiments and high-level variants are described in sect. 1. Technical implementation details are discussed in the second section.

1. General Embodiments and High-Level Variants

In reference to FIG. 1, an aspect of the invention is first described, which concerns a spin logic device 100. FIG. 1 is a side view of a simplified representation of such a spin-logic device, according to embodiments. Briefly, this view represents components of the device, including various layers of semiconductor materials 7, 8, and 9, as well as a spin injection as input device 1 and spin detection as output device 4. The device 100 is configured to enable the formation of persistent spin helices (PSHs) having periodicity $\lambda$ along direction x, as symbolically represented above the device 100.

In more detail, the device 100 first includes an electron confinement layer, the latter confining an electron gas in a two-dimensional area where this electron gas is accordingly later referred to as 2DEG, for simplicity. The two-dimensional area is subtended by perpendicular directions x and y where direction y is perpendicular to the plane of the drawing. Typically, the device 100 includes three or more layers 7, 8, 9 of semiconductor materials: the electron confinement layer is for example formed within layer 8, or at an interface 87 or 89 between two contiguous layers 7, 8 or 9. Additional layers can be involved. The layers 7, 8, 9 can themselves decompose into sub-layers, as needed, to achieve a 2DEG with suitable properties.

However, the 2DEG can be confined within only one layer of semiconductor material. In variants, the electron confinement layer can be formed at an interface between a layer of semiconductor material and an additional layer of a semiconducting, metallic or insulating material.

How to achieve this shall be discussed later in details. For the time being, we assume that the device 100, and in particular the layers 7, 8, 9 of semiconductor materials can be engineered such that the 2DEG can support a helical spin mode. More precisely, a PSH formed in the 2DEG shall have a given spin component, e.g., $S_z$ or $S_x$, oscillating with periodicity $\lambda$ along a given in-plane direction, for example direction x, but not oscillating along the perpendicular otherwise known as in-plane direction y.

Second, the device 100 includes a logic circuit, which preferably is configured as a majority logic circuit. The circuit includes one or more input devices 1 where only one such device appears on FIG. 1, i.e., spin-injection devices, which upon suitable energization create local spin-polarizations 3 of the 2DEG in respective first regions 10 of the confinement layer. The "first regions" 10 are also referred to as "input regions" or "spin injection regions" in the following. If the input devices are simple electrodes, as in the example of FIG. 1, the first regions 10 simply correspond to locations in x of the electrodes. Other types of input devices and spin injection mechanisms shall be discussed later.

Specific designs of electron confinement layers as assumed herein are such that a local spin excitation shall evolve into a PSH. Thus, local spin-polarizations 3 shall result in the formation of respective PSHs, through which spin-polarizations "helically" propagate, resulting in spin oscillations, as schematically depicted in FIG. 1 too. Thus, the PSH-based spin propagation involves oscillations, beyond mere spin diffusion.

A spin-detection device 4, or simply "output device" is furthermore provided to detect, in a second region 40 of the confinement layer, an average spin-polarization 6 of the 2DEG that results from the spin-polarizations propagated through the PSHs. The "second region" 40 can also be hereafter referred to as the "output region" or "detection region".

As it can further be realized from FIG. 1, to properly exploit the spin-polarization information as diffused along PSHs, the distance d between a region 10 of spin-injection and a detection region 40 must be set according to the oscillation periodicity $\lambda$ along direction x. For example, in FIG. 1, the detection region 40 is at a distance d=λ from the region 10 of spin-injection. However, it can further be realized that the detection region 40 can be set at a distance d=$\lambda/2$ from the first region 10. At d=$\lambda/2$, the polarization is simply reversed with respect to d=λ.

Furthermore, detection can even be set at d=$\lambda/4$, provided that the output device is able to detect perpendicular spin-polarizations. Note that in FIG. 1, the distance between input/output regions corresponds to the distance between input/output devices since the latter are assumed to be electrodes in that case, which electrodes enable spin injection/detection at their respective positions along x. However, this need not be always the case, depending on the spin injection/detection mechanism chosen. Thus, it is the distance d between input/output regions that must be set according to $\lambda$, rather than the distance between input/output devices.

So far, the distance d referred to above corresponds to direction x in FIG. 1, as the latter is a section view. Now, location constraints as to the other direction y which is perpendicular to the section view of FIG. 1 are much less stringent, since spin polarization diffuses along y and does not oscillate. This point is now discussed in reference to FIGS. 2A-2C, which show density plots, representing a PSH formation which is direct mapping, as obtained from simulations. The latter were obtained thanks to a custom-made program, using a Monte-Carlo approach, which takes into account spin diffusion and precession of spin about the spin-orbit field; typical material parameters for a GaAs/AlGaAs quantum well structure were used. Representative contours have been emphasized in the density plots.

At variance with FIG. 1, initial spin polarization is along z-axis in this example. The density plots capture the formation of a PSH at three different times after spin injection, namely 25, 300, and 900 ps, it being noted that the lifetime of a PSH is on the order of nanoseconds. It is noted, in that respect, that detection can be optimally synchronized with injection. The maximal amplitudes at a distance d from the input region will be reached a certain time after injection that depends on the spin diffusion constant D and is given by $d^2/D$ where typically 1 ns is for d=5 μm for GaAs quantum wells. Timing can thus be adjusted by varying distance d between input/output regions and/or selecting materials having suitable parameters.

As seen in FIGS. 2A-2C, owing to the quite "large" diffusion observed along y, there is no need to set detection at y=0, i.e., vis-à-vis the injection region. Formally, what is needed is that the projection onto axis x of the distance d between the second region 40 and the first region 1 or more generally any one of the injection regions be "in-phase" with characteristic polarizations of the PSH. In mathematical terms, this projection, call it $d_x$, should be essentially equal to $n\lambda/a$, with n integer and a equal to 2 or 4. Thus, one can typically have $d_x$ equal to $\lambda/4$, $\lambda/2$, or $\lambda$, etc.

This opens the possibility to use several input devices 1. In this regard, the logic circuit is preferably configured as a majority logic circuit, which typically includes at least three input devices. Preferably, an odd number of inputs are used, to enable "majority". This is however not always the case, as exemplified in FIG. 7. In the simplest implementations, these input devices or subsets thereof are typically aligned parallel to direction y, as to be discussed later in detail in reference to FIGS. 3-8. Of course, this shall not be the case if input devices are purposely shifted as in FIG. 7, e.g., for inverting the input state.

As illustrated in FIGS. 3-4, detection is nonetheless preferably set vis-à-vis the input devices. Formally, this means that the distance between the second region 4 and the closest one of the first regions 1 corresponding e.g., to the input device in the middle is preferably set equal to $n\lambda/a$, with n integer, and a equal to 2 or 4 where a=2 and n=4 in the examples of FIGS. 3-4. In other words, detection can be set in front of one of the inputs. Similarly, if the detection region is chosen to extend over a large distance, e.g., comparable to the length of extension of the input devices along y, then the output device is preferably located vis-à-vis the input devices.

Ideally, the injection/detection regions should be located as accurately as possible, to exploit maximal amplitudes of the spin-polarization. However, it can be realized from FIG. 1 or 2 that slight misalignments are not critical. A misalignment is tolerated as long as it can clearly be discriminated amongst two spin polarizations of interest, which otherwise depend on the distance retained. The misalignment should not exceed $\lambda/4$, as it can be realized from FIG. 1. Yet, much larger signal magnitudes are obtained in practice if the misalignment is smaller than $\lambda/8$. Thus, one understands that the projection $d_x$ of distance d onto axis x should be essentially equal to $n\lambda/a$, i.e., equal to $n\lambda/a \pm \lambda/b$ with b>4 and preferably b>8. Accordingly, if the input/output devices used are electrodes, the extension dimensions of the latter along x should typically be less than $\lambda/2$ assuming perfect alignment, and preferably less than $\lambda/4$ if the misalignment remains smaller than $\lambda/4$.

Next, input/output devices can be of any suitable type; such devices are known per se. However, more versatile spin logic devices shall be obtained if each spin injection device is able to selectively inject spins up and spin down. Suitable spin injection can notably occur through spin transfer from a ferromagnetic layer into the confinement layer, by means of photoexcitation, or by any spin-dependent transport process, as e.g. spin-dependent tunneling.

Similarly, various spin-polarization detection methods are known. For example, the created and detected spin polarization is along a given direction that is perpendicular to the spin-orbit magnetic field. The direction of the spin-orbit magnetic field depends on the crystalline direction along which the electron confinement is realized, e.g. in zincblende semiconductors supporting a persistent spin helix, this direction is in-plane along y for confinement along [100], and out-of-plane for confinement along [110]. Therefore, two possible directions for created and detected spin polarization are along x and out-of-plane for [100] confinement, and along x and along y for [110] confinement.

Thus, the present invention can be embodied with output devices 4 configured to detect an average spin-polarization for any spin component that oscillates along x, for example components $S_z$ or $S_x$ in FIG. 1. Notably, if $d_x = n\lambda/a$ with a=4 and n odd, then the output device should be configured to detect spin polarization that is along a direction perpendicular to the direction of spin polarization injected by the input device. For example, the output device can be configured to detect perpendicular spin-polarization rather than in-plane. More generally, use can be made of spin-polarization input/output devices that create/detect in-plane and/or out-of plane spin polarizations.

Next, FIGS. 3A-3B represent simulated density plots of PSHs, which are formed in step S30 after spin-injections in step S20 at input devices 1a, 1b and 1c. Spin-injection is ideally carried out simultaneously at the input devices, i.e., such as to create parallel PSHs that progressively merge. The input devices 1a, 1b and 1c, together with the output device 4, are schematically represented as superimpositions to the density plots. In FIG. 3A, the initial spin polarizations along x in this example are the same at each input device, and assumed to correspond to spin up or logical value "1". The initial, parallel polarizations evolve into respective PSHs, which partly overlap and merge such as to lead to a stripe pattern similar to that of FIG. 2B or 2C. Note that in FIG. 3B, the initial spin polarizations at input devices 1a, 1c are the same, but are opposite to initial polarization at device 1b. The latter is assumed to correspond to spin down or logical value "0", as shown in the legend. In that case, spin polarization mixing in the STL results which reflects how spin propagation is modulated. This mixing notably affects the average polarization that results in the region corresponding to the output device 4.

In each of FIGS. 3A and 3B, the initial polarizations are synchronously inputted, at the level of first regions corresponding to the input devices 1a-1c. The output device 4 subsequently detects in step S40 the average spin-polarization that results at the level of the detection region. Detection can be timely set, e.g., 1 ns after injection. As illustrated in FIG. 3A, the PSHs that are fully in phase in that case result in a "large" average spin-polarization along x at the level of the detection 4. If, on the contrary, the created spin-polarizations exhibit opposite spin-polarizations as in FIG. 3B, the PSHs are only partly in phase, resulting in a "lower" average spin-polarization at the output 4. More schematic depictions of FIGS. 3A-3B are given in FIGS. 3C-3D. Beyond these two examples, several combinations of spin-polarization can be contemplated for the injection, a thing that enables implementation of majority logic together with PSHs, using one of the inputs, e.g., input 1c, as a control input.

More precisely, devices such as described above allow for intermingling majority logic concepts with PSHs. In particular, an advantage of PSHs is that one can easily reverse the injected/detected values. For example, one can reverse the output by shifting the output device by $m\lambda/2$, m odd, along x. This has fantastic advantages for the construction of logic devices. In this regard, using $d_x=n\lambda/a$ with small values of n and/or with a=4 reduces the footprint of the logic arrays, thereby enabling high integration density. On the other hand, using $d_x=n\lambda/a$ with large values of n allows for building more complex logic arrays, notably by adding more input/output devices at definite locations on the PSH.

These points are now discussed in more detail in reference to FIGS. 3C-8, which schematically illustrate the construction of logic gates using a PSHs to propagate information from spin injection devices 1, 1a, 1b, etc. to output devices 4, 4a, 4', etc., according to various embodiments. Basically, in each of the embodiments of FIGS. 3C-8: the spin logic devices 100 are operated as follows:

First, one or more of the input devices are energized, step S20, to create local spin polarizations in correspondence with the input devices. Owing to the specific device conceptions as contemplated here, one or more PSHs correspondingly develop, step S30; and Second, an average spin-polarization is detected via the output device(s), step S40.

Some applications, e.g., FIGS. 3, 4, 6 and 7, make advantageously use of majority logic where two or more logic inputs, e.g., A and B in FIGS. 3-4, and one control input C, each provided by respective input electrodes 1a, 1b and 1c, are wired together, and the result of the logic gate is determined by the average of spin-polarization resulting from the three inputs at the level of the output electrode 4.

In FIGS. 3 to 7, the view is "onto" the 2DEG in plane x and y, with the direction of the PSH oscillation along the horizontal x direction. The direction in which spin polarization stays constant is along the y direction. Spin polarization is encoded in a grey scale. Black means spin up and white spin down. As touched earlier, spin up and down are defined as spin polarization along or against a specific direction that can be either the direction perpendicular to the 2DEG or the direction along which the PSH forms as x-axis in the drawings. Spin signals propagate along x where they also diffuse along y, yet without oscillating.

Figure 6:
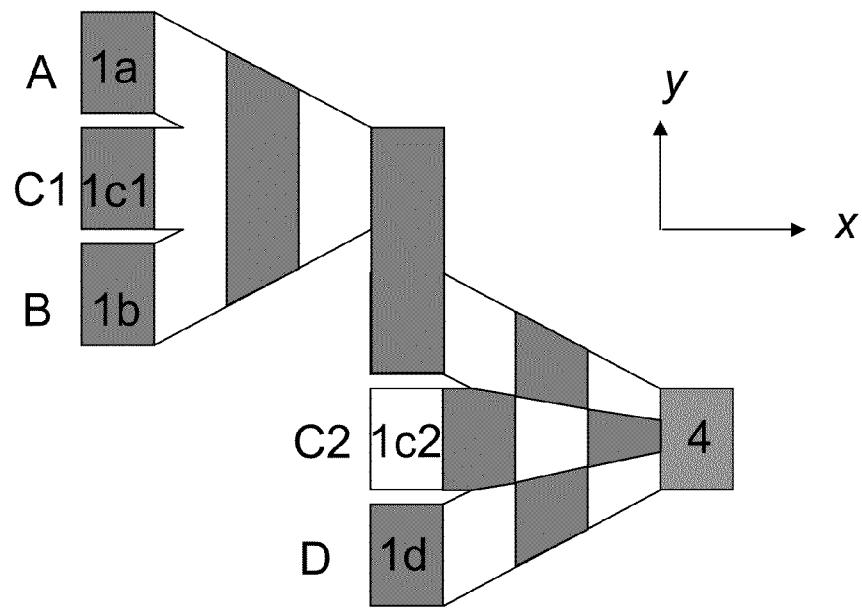
Figure 7:
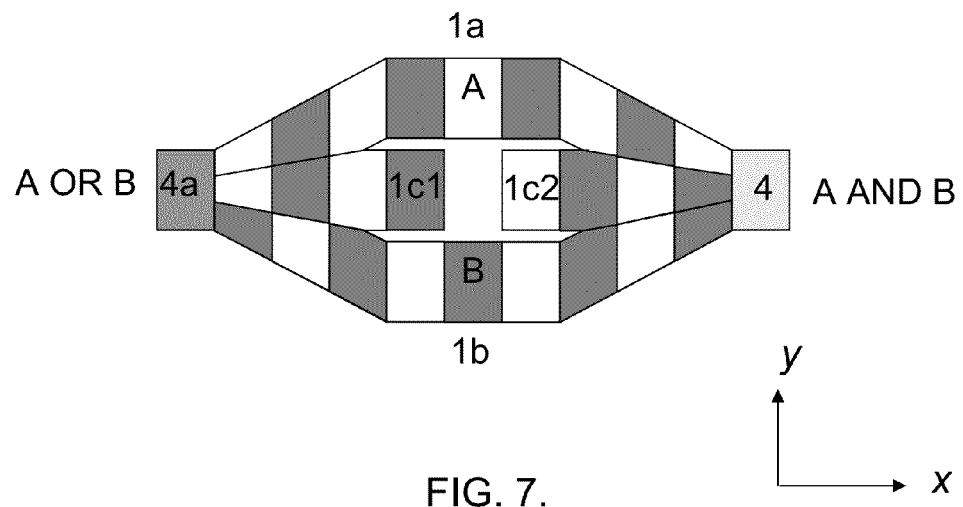
Figure 8:
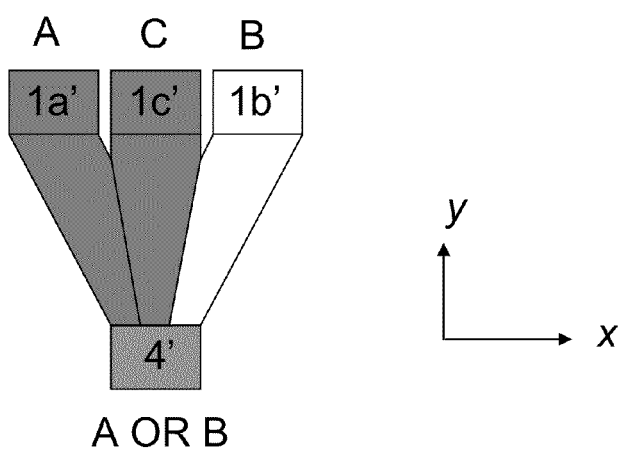

Briefly, AND and OR logic gate operations can be performed by propagating spin along either the x or the y direction, whereas inversion (NOT) is implemented by spin propagation along the x direction. Examples of AND, OR and NOT gates realized using spin propagation along the x direction are shown in FIGS. 3-5. A cascade of two logic gates using spin propagation along both x and y directions is shown in FIG. 6. Since spin propagates along all directions, one input electrode can provide input spin polarization for several gates where propagation of spin polarization is along different directions. FIG. 7 shows an example where two different logic gates, A AND B and A OR B, are realized using spin propagation along +F and −x directions. This construction uses two input electrodes 1 providing inputs A and B. The two logic gates use spin that propagates along −x (A OR B) or +x (A AND B) direction. Finally, an example of an OR gate with spin propagation along the y direction is shown in FIG. 8. In this latter case however, no use is made of the PSH mode, such that no simple reversal is possible in that case.

In FIGS. 3C-3D, 4A-4B, and 6-8, the logic circuit is designed as a majority logic circuit. Referring more particularly to FIGS. 3-4, the circuit can for instance include at least three input devices 1a, 1b, 1c, aligned along direction y. This includes two logic inputs 1a, 1b and at least one control input 1c. Of course, simpler logic gates such as NOT shall need only one input and one output, as illustrated in FIG. 5, and therefore do not require a majority logic. In the latter case, one can clearly understand the interest of a PSH, which allows for simple inversion, over a distance of $\lambda/2$. Yet, the minimum feature size is generally not limited to $\lambda/2$, as already touched upon above.

More complex gates can be designed, as exemplified in FIGS. 6-7. FIG. 6 is an example of a combined logic gate calculating A OR B, AND D. In this regard, the spin logic device 100 can further include an additional set of input devices 1c2, 1d, functionally similar to those described earlier. This additional set allows for injection at a distance from both the input regions corresponding to the first set of input devices 1a, 1b, 1c1 and the output regions corresponding to output device 4. Again, references 1a, 1b refer to logic inputs while 1c1 and 1c2 refer to control inputs. In the following, the injection, response detection, regions are assumed to correspond to the x-locations of the corresponding input, response Output, devices, for simplicity as this is the case with electrodes. Formally, the x-projection of the distance between any one of the additional injection regions 1c2, 1d and any one of the first injection regions 1a, 1b, 1c1 is equal to $l\lambda/a$, where l is integer and a is equal to 2 or 4. One can for instance have l=n/2=2, like in the example of FIG. 6.

FIG. 7 illustrates the construction of two logic gates which are A OR B, and A AND B. In this regard, the spin logic device 100 can further include an additional output device 4a, opposite to the first output device 4 with respect to input devices 1a, 1b, the additional output device configured to detect an average spin-polarization within a respective region, call it "fourth" region, of the confinement layer. The fourth region 4a is at a distance from the first region 1, a projection of the distance onto direction x being equal to $m\lambda/a$, m integer, a equal to 2 or 4, and wherein preferably m=n where it is reminded that the second detection region 4 is located at $n\lambda/a$ from the first region 1. Note that the control inputs are shifted with respect to the logic inputs in the example of FIG. 7.

For completeness, although embodiments above all take advantage of a PSH, it does however not prevent a device 100 to include additional components, to enable logic gates in directions where no-spin oscillation arises, e.g., direction y in the appended drawings. For example, the spin logic device 100 can further include an output device 4' configured with respect to input devices 1a', 1b', 1c' that are aligned along x, to detect an average spin-polarization propagating along direction y, as illustrated in FIG. 8. FIG. 8 is an example of an OR gate along direction y, where the spin does not oscillate.

Finally, in each of the embodiments of FIGS. 3-6 and 8, only one detector 4 is shown which measures an average spin-polarization in a corresponding, finite detection region. This detector is typically located in front of a control electrode, which itself is located in the middle of an aligned set of input electrodes; this gives some symmetry with respect to the two input states, but is not necessary. Rather, the control input electrode can be at any position along y or at least close enough to the logic inputs to enable the correspondingly formed PSHs to merge, and the output electrode is preferably set symmetrically to the position of the three input electrodes, i.e. at the y position of the middle input electrode. In variants, a set of several detectors 4 can be used aligned such that each detector faces an input electrode. An average of the spin-polarizations as measured via each of the output electrodes can accordingly be performed, to enable majority logic. Such variants require more complex circuits. On the other hand, they can allow for clearer discrimination between spin-polarizations.

2. Technical Implementation Details

This section describes in more detail:
how to use a 2DEG as a STL;
how the 2DEG has to be designed in order to allow for propagation of spins over large distances; and
how the STL has to be designed in order for the spin polarization in the 2DEG to spatially alternate between spin up and spin down, forming a PSH.

In reference to FIG. 1, the STL can be obtained by way of semiconductor layers 7, 8, and 9 hosting the 2DEG. The 2DEG can for example be confined to a quantum well, i.e. to semiconductor layer 8 in FIG. 1, where electrons are in states of lower energy than in the surrounding layers 7 and 9. In variants, the 2DEG can be located at an interface, i.e., between layer 8 and either layer 7 or 9. The electrons in that 2DEG typically provided by dopants in layers 7, 8 and/or 9. The material of such semiconductor layers can be alloys and ternary alloys of III-V materials e.g. GaAs, AlAs, InAs, InP, InSb or II-VI materials e.g. CdSe, CdTe, ZnSe.

In variants, the 2DEG can be formed within a single semiconductor layer, at the interface with a contiguous insulating or metallic layer, and electrons are provided by field-effect using an electric field. In addition, an electric field applied perpendicular to the layer can be used to condition the system for it to be able to support a PSH, if necessary.

Connected to the 2DEG are input 1 and output 4 electrodes, as evoked earlier. The input electrodes act as spin injection contacts and consist of a magnetic material that is magnetized into one of two directions, i.e., spin up or spin down, as denoted by reference 2 in FIG. 1. In the example of FIG. 1, the injection direction is along direction x. By passing a current between the input electrodes and the 2DEG, spin-polarized electrons can be accumulated in the 2DEG in a given injection region 10, e.g. at the interface between the input electrode and the 2DEG. The spin polarization of the electrons at that location in the 2DEG is directly related to the magnetization of the input electrode, i.e. the spins in the 2DEG are also either up or down. The output electrodes convert the local spin polarization in the output region typically at the interface between the 2DEG and the output electrode into either an electrical signal or into a magnetization state of another input electrode: the latter can be the output electrode or another electrode close-by that takes over the spin polarization of the 2DEG at the interface. This makes it possible to amplify the spin polarization of the 2DEG into a magnetization of the ferromagnetic material and back into the STL.

Figure 9:
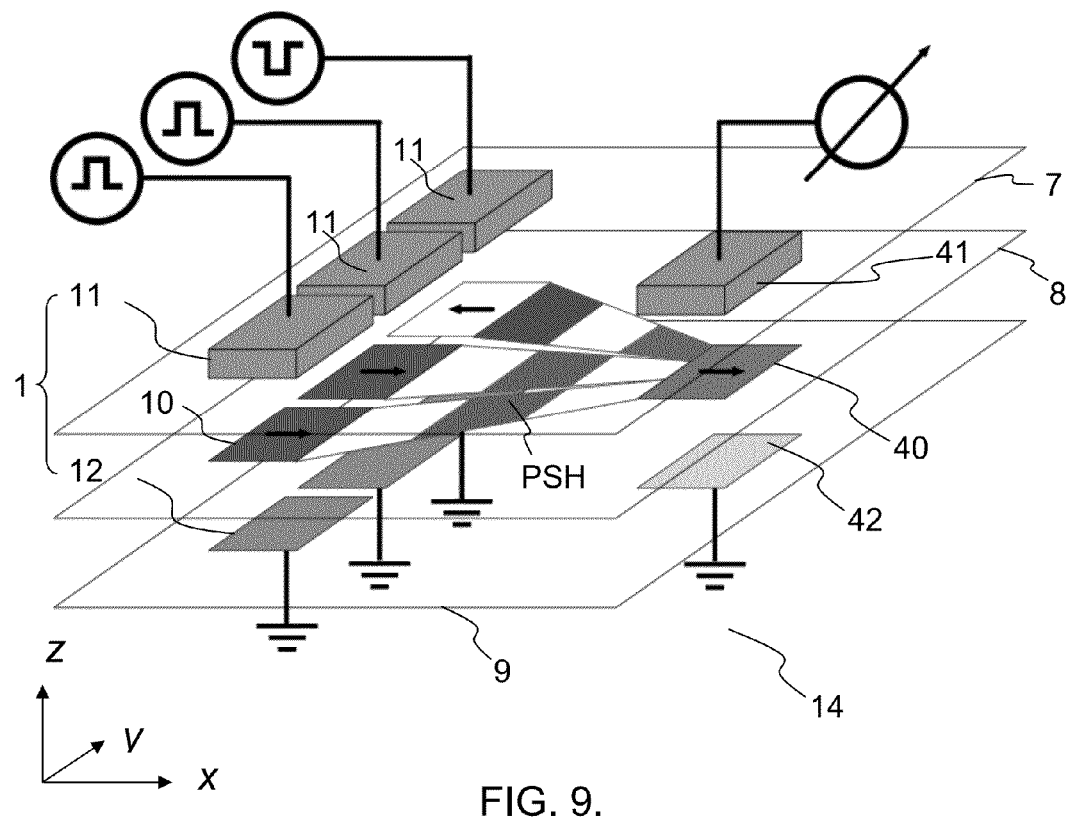
FIG. 9 shows details of a majority logic circuit as involved in embodiments.

In between the input and output electrodes, the spin polarization imprinted by the input electrode propagates in the 2DEG by diffusion or drift. An example of a majority logic circuit 14 is depicted in FIG. 9. The circuit shown here enables construction of logic gates such as depicted in FIGS. 3, 4, and 8. Simple variants thereof shall enable logic gates as depicted in FIGS. 5-7. In FIG. 9, electrical pulses are applied to ferromagnetic electrodes 11, each having a counter-electrode 12 located below the 2DEG and connected to ground potential, thereby forming an input device 1. An electrical pulse applied to one of the electrodes 11 leads to a spin-polarized current that polarizes the spins of the 2DEG in region 10 along a positive or negative x-direction, depending on whether the magnetization of the electrode 11 is along +x or −x, and depending on the polarity of the electrical pulse. In the example, one pulse has opposite polarity compared to the others, such as to form opposite spin polarizations as in FIG. 3D. Spin-polarized electrons accumulate in the 2DEG, in regions 10 corresponding to electrode locations and propagate through the subsequent PSH. A non-local voltage at ferromagnetic electrode 41 is here detected using a voltage-measurement circuit, connected to electrode 41 and a counter electrode 42, which together form an output device 4, to convert the local spin polarization in region 40 into an electrical signal.

The spins of the electrons in a 2DEG hosted in a semiconductor heterostructure are exposed to spin-orbit interaction (SOI). There are two separate contributions to SOI. One contribution originates from the bulk inversion-asymmetry, e.g., of III-V and II-VI semiconductor materials, called BIA. The second contribution originates from structure inversion asymmetry, otherwise called SIA that can be engineered by choosing different materials for layers 7, 8, and 9 in FIG. 1 or different doping concentrations on the two sides 7 and 9 of the 2DEG. A special symmetry of the SOI occurs when contributions of SIA and BIA are equal. Then, a persistent spin helix (PSH) forms where the spin polarization of diffusing electrons processes in a way that a wave-like pattern forms along a specific crystal direction of the semiconductor that is in the plane of the 2DEG.

Decay of spin-polarization in a PSH is strongly suppressed along both in-plane directions such that diffusing spins can propagate over long distances. The spin polarization oscillates along one spatial dimension in-plane with the 2DEG e.g., direction x, which is given by a crystal direction of the semiconductor host. Along the perpendicular in-plane spatial direction, e.g., direction y in FIG. 1 the polarization stays essentially constant. The period of the spin oscillation is determined by the spin-orbit length $l_s$, the periodicity ② of the resulting PSH is precisely equal to $l_s$, that is determined by the strength of the SOI and the mass of the electron. The spin-orbit length can be in the range of 10 nm to 10 μm for typical III-V and II-VI materials. It can be tuned to some extent by gate electrodes above and/or below the 2DEG. Persistent spin helices have been predicted and observed. If the 2DEG is laterally confined to a channel of a width that is smaller than the spin-orbit length $l_s$, a PSH also forms if SIA and BIA are not equal.

For example, the layers of semiconductor materials 7, 8, and 9 can each exhibit zincblende structure, and be grown along the [110] direction with the layers being perpendicular to that direction, such as to define zero structure inversion asymmetry. In this case, the persistent spin helix is formed by the spin-orbit field that originates from the bulk inversion asymmetry alone, which is oriented along the [110] direction.

A working sequence of semiconductor layers, e.g., grown by molecular beam epitaxy, is the following from the bottom-to-top in FIG. 1:

Substrate: GaAs (001) wafer;
Layer 9 can include, successively,
    500 nm $Al_{0.3}Ga_{0.7}As$
    Si doping in a delta layer, ~6 $10^{11}$ $cm^{-2}$; and
    20 nm $Al_{0.3}Ga_{0.7}As$
Central layer 8 can include 12 nm GaAs; and
Layer 7 can finally decompose into:
    90 nm $Al_{0.3}Ga_{0.7}As$; and
    5 nm GaAs.

As the earlier, electrodes extend along x over a distance that preferably is less than ②/2, more preferably less than ②/4. Extension along y is arbitrary; extension along y does not have to be the same for different inputs and for input and output electrodes.

Typical current intensity/voltages used to "energize" the electrodes shall depend on the specific realization of spin injection contacts. "Energizing" the electrode can typically involve:

(1) pass an electrical current between the ferromagnetic electrode and the 2DEG, possibly involving second contacts below the 2DEG and the ferromagnetic contact, as shown in FIG. 9. The direction of the current determines the polarization direction of the spins along or against the magnetization of the electrode. Alternatively, the magnetization of the electrode can be reversed by a local magnetic field or by spin transfer torque;

(2) excite spin-polarized electrons into the conduction band using circularly polarized photons. The helicity of the circular polarization, right-circularly polarized or left-circularly polarized, determines the direction of the excited spin polarization; or (3) any other technique that allows for creation of local spin polarization, i.e. current-induced spin polarization, spin-dependent tunneling, etc.

Reading out the spin at the output is for example done by measuring a current between the 2DEG and a ferromagnetic layer. At a given voltage, the current is higher or lower depending on the direction of the spin polarization in the 2DEG below the output electrode with respect to the magnetization of the ferromagnetic layer.

As compared to spin waves in ferromagnetic materials, preferred embodiments of the invention do not require AC driving of the input to propagate the spin wave in the present embodiments. A PSH forms because of dissipation-less diffusive transport of spin polarization combined with spin-orbit interaction. The PSH forms with nodes and antinodes at constant spatial positions, so the result of the logic operation is provided as the spin polarization at a given spatial position, and no phase-sensitive detection of a traveling wave has to be achieved.

Different to magnetic cellular automata, the timing of the computation is achieved by subsequent triggering of input write and output read operations, thereby greatly enhancing the reliability of the computation.

The majority-logic concepts introduced in prior art documents require spin diffusion to drive the signal from input to output. Using a two-dimensional electron gas in the PSH mode—as proposed here—significantly enhances the spatial extension of spin diffusion, and by using the oscillating spin polarization, an easy implementation of inverters, NOT-operations, and selection between AND and OR gates become possible. Such selection is achieved by either reversing the magnetization of the input electrode of control input C, or by shifting the input electrode of control input C by a distance along the x-axis of ②/2=$l_x$/2.

No Ohmic loss, charge dissipation, occurs for logic operations since spin in a PSH propagates without current. The speed of signal propagation is limited by spin diffusion, the time needed to propagate the spin polarization over a distance $D_x$ scales with $D_x$ to the power of two, which is advantageous when scaling to smaller dimensions. At larger $D_x$, a propagation time linear in $D_x$ can be achieved if an in-plane electric field is applied to induce drift to the electrons of the 2DEG.

While the present invention has been described with reference to certain embodiments, it will be understood by those skilled in the art that various changes can be made and equivalents can be substituted without departing from the scope of the present invention. In addition, many modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In that respect, not all the components/steps depicted in the accompanying drawings need be involved, depending on the chosen embodiments. In addition, many other variants than explicitly touched above can be contemplated. For example, additional semiconductor layers can be involved, and/or other chemical compositions can be used for these layers.

The invention claimed is:

1. A spin logic device, comprising:
an electron confinement layer confining an electron gas in a two-dimensional area (2DEG) subtended by a direction x and a direction y, the latter being perpendicular to the former, the spin logic device being configured for the 2DEG to support a persistent spin helix (PSH) formed therein with a given spin component oscillating with periodicity λ along direction x but not oscillating along direction y; and
a logic circuit, comprising: (i) at least one input device, energizable to create respective local spin-polarizations of the 2DEG in respective first regions of the confinement layer, to form respective PSHs; and (ii) an output device configured to detect, in a second region of the confinement layer, an average spin-polarization of the 2DEG resulting from one or more local spin-polarizations created by the one or more input devices and diffused through one or more resulting PSHs wherein a projection of a distance (d) between the second region and any one of the first regions onto said direction x is equal to nλ/a, n integer, a equal to 2 or 4.

2. The spin logic device according to claim 1, wherein the logic circuit is a majority logic circuit that comprises at least three input devices.

3. The spin logic device according to claim 2, wherein said at least three input devices are aligned along direction y.

4. The spin logic device according to claim 3, wherein the majority logic circuit comprises at least two logic inputs and one control input.

5. The spin logic device according to claim 1, wherein the output device is configured to detect an average spin-polarization for: said given spin component if a=2; and/or a perpendicular spin component if a=4 and n is odd.

6. The spin logic device according to claim 1, further comprising an additional set of at least one input device, energizable to create respective local spin-polarizations of the 2DEG in respective third regions of the confinement layer to form respective PSHs, wherein a projection of a distance between at least one of the third regions and any one of the first regions onto said direction x is equal to lλ/a, l integer, a equal to 2 or 4, with preferably l=n.

7. The spin logic device according to claim 1, wherein said output device is a first output device, the spin logic device further comprising:
an additional output device, opposite to the first output device with respect to at least one input device; and
the additional output device configured to detect a spin-polarization of the 2DEG within a fourth region of the confinement layer, the fourth region at a distance from the first region, a projection of said distance onto direction x being equal to mλ/a, m integer, a equal to 2 or 4, and wherein m=n.

8. The spin logic device according to claim 1, wherein the spin logic device further comprises at least one output device configured with respect to at least one input device to detect an average spin-polarization of the 2DEG propagating along direction y in the confinement layer.

9. The spin logic device according to claim 1, wherein the spin logic device comprises at least three layers of semiconductor materials, and the electron confinement layer is formed within one of said at least three layers.

10. The spin logic device according to claim 1, wherein the spin logic device comprises at least three layers of semiconductor materials, and the electron confinement layer is formed at an interface between two contiguous layers of said at least three layers.

11. The spin logic device according to claim 10, wherein the layers of semiconductor materials determine a symmetry of the spin-orbit interaction (SOI) to which the 2DEG is exposed such that the 2DEG is adapted to support said persistent spin helix.

12. The spin logic device according to claim 11, wherein the layers of semiconductor materials define a given bulk inversion asymmetry and a given structure inversion asymmetry, the symmetry of the SOI determined by said given bulk inversion asymmetry and said given structure inversion asymmetry.

13. The spin logic device according to claim 1, wherein the input devices are electrodes, whose extension dimensions along direction x is less than $\lambda/2$.

14. The spin logic device according to claim 13, wherein the input devices are electrodes, whose extension dimensions along direction x is less than $\lambda/4$.

15. The spin logic device according to claim 1, wherein a distance (d) between the second region and the closest one of the first regions is equal to $n\lambda/a$, n integer, a equal to 2 or 4.

16. The spin logic device according to claim 1, wherein a distance (d) between the second region and the closest one of the first regions is equal to $n\lambda/a$, n integer, and wherein, a=2 and n=4.

17. A method of operating a spin logic device having a logic circuit, the method comprising:
  energizing one or more of input devices in the spin logic device; and
  detecting an average spin-polarization of electron confinement layer confining an electron gas (2DEG) in the spin logic device via the output device.

18. The method according to claim 17, wherein the logic circuit of the spin logic device is a majority logic circuit having at least two logic inputs and at least one control input.

19. The method according to claim 18, wherein the control input and at least two logic inputs are energized to create respective local spin-polarizations of the 2DEG.

20. The method according to claim 19, wherein created spin-polarizations exhibit opposite spin-polarizations.

* * * * *